(12) United States Patent
Chabrecek et al.

(10) Patent No.: US 8,598,779 B2
(45) Date of Patent: Dec. 3, 2013

(54) OPTOELECTRONIC FILM ARRANGEMENT WITH A TRANSLUCENT LAYER

(75) Inventors: Peter Chabrecek, Freidorf (CH); Hanspeter Meier, Schachen (CH); Muriel Lantus, Berneck (FR); Uriel Sonderegger, St. Gallen Winkeln (CH)

(73) Assignee: Sefar AG, Thal, Thal/SG (CH)

( * ) Notice: Subject to any disclaimer, the term of this patent is extended or adjusted under 35 U.S.C. 154(b) by 0 days.

(21) Appl. No.: 13/265,018

(22) PCT Filed: Apr. 20, 2010

(86) PCT No.: PCT/EP2010/002410
§ 371 (c)(1),
(2), (4) Date: Oct. 18, 2011

(87) PCT Pub. No.: WO2010/121785
PCT Pub. Date: Oct. 28, 2010

(65) Prior Publication Data
US 2012/0043879 A1   Feb. 23, 2012

(30) Foreign Application Priority Data

Apr. 20, 2009   (DE) .................. 10 2009 017 787

(51) Int. Cl.
*H01J 1/62* (2006.01)
*H01J 63/04* (2006.01)

(52) U.S. Cl.
USPC ........... 313/503; 313/483; 313/500; 313/501; 313/502; 313/504; 313/505; 313/506

(58) Field of Classification Search
None
See application file for complete search history.

(56) References Cited

U.S. PATENT DOCUMENTS

| | | | |
|---|---|---|---|
| 8,431,185 B2 * | 4/2013 | Neudeck et al. | 427/157 |
| 2008/0220678 A1 | 9/2008 | Neudeck et al. | |
| 2009/0117327 A1 | 5/2009 | Takada | |
| 2011/0247689 A1 | 10/2011 | Chabrecek et al. | |

FOREIGN PATENT DOCUMENTS

| | | |
|---|---|---|
| DE | 10333583 A1 | 9/2004 |
| WO | 9748254 A1 | 12/1997 |
| WO | 03005775 A1 | 1/2003 |
| WO | 2005062679 A1 | 7/2005 |
| WO | 2009060717 A1 | 5/2009 |
| WO | 2010051976 A1 | 5/2010 |

* cited by examiner

*Primary Examiner* — Natalie Walford
(74) *Attorney, Agent, or Firm* — Bachman & LaPointe, P.C.

(57) ABSTRACT

An optoelectronic film assembly, has a first flat electrode layer, a second flat electrode layer as a counter electrode to the first flat electrode layer, a dielectric layer between the electrode layers and an active layer provided next to the dielectric layer and arranged between the electrode layers and made of an electroluminescent material. To this end, the first and/or the second electrode layers are implemented to be translucent and TCO-free, particularly ITO-free, by using a woven fabric comprising electrically conductive fibers.

43 Claims, 2 Drawing Sheets

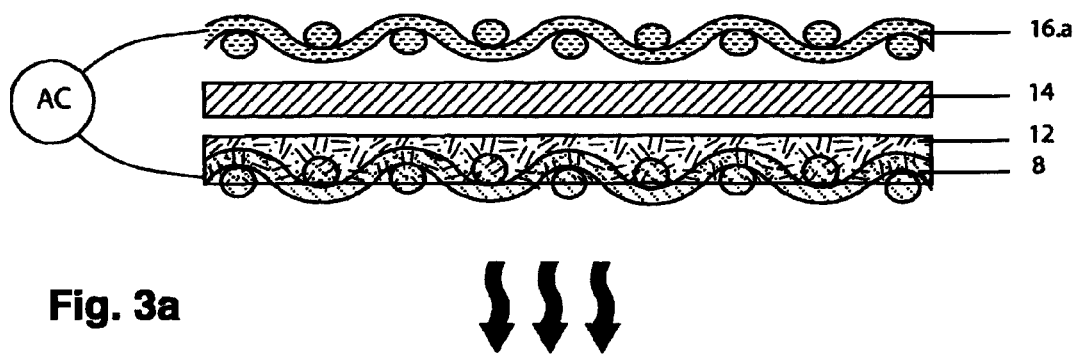
Fig. 3a
Fig. 3b
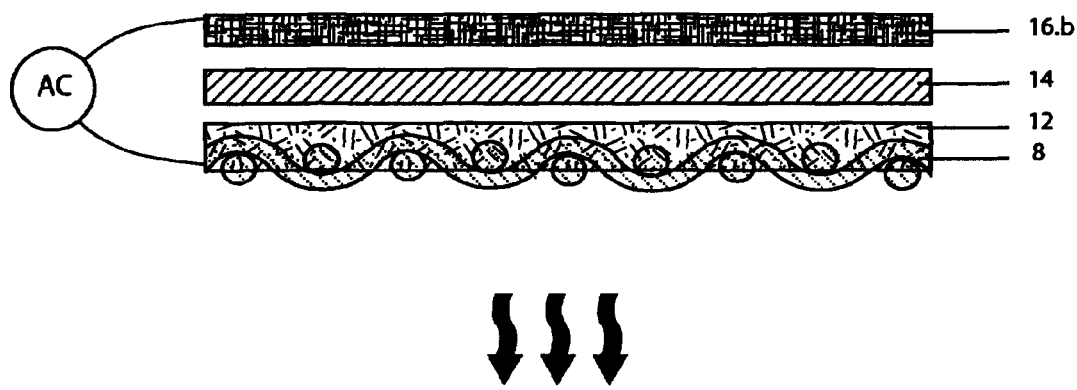

OPTOELECTRONIC FILM ARRANGEMENT WITH A TRANSLUCENT LAYER

BACKGROUND

The present invention concerns an optoelectronic film arrangement, in particular an electroluminescence (EL) film, in accordance with the preamble of the main claim.

Such devices are of general known art from the prior art, and by virtue of their advantageous planar lighting properties in conjunction with low power consumption and extended lighting times, are deployed in a very wide variety of application fields, primarily in the implementation of warning or message surfaces in lighting, advertising, design and architecture.

Planar, film-type electroluminescence devices are based on the functional principle that a so-called active layer, typically consisting of doped zinc sulphide as an electroluminescent material, and a dielectric layer, are provided between two planar electrodes in the manner of a plate condenser, and that this arrangement, when powered by an alternating voltage signal (with a typical frequency between approx. 200 Hz and 4 kHz) emits a cold, planar and non-directional light. The amplitude and frequency of the applied alternating voltage can alter the brightness (and, within limits, also the colour) of the light emission.

In the constructional implementation EL film arrangements of known prior art in accordance with the preamble of the main claim typically have, as a first electrode, a polymer substrate, which is coated with indium tin oxide (ITO), as an implementation of a translucent conductive oxide (TCO), typically by means of vacuum sputtering, such that a conducting, but nevertheless translucent electrode layer is formed. On this coating is provided an active layer of an electroluminescent material, to form a similarly planar and typically non-translucent counter-electrode, implemented, for example, by means of a circuit board; the active layer typically uses zinc sulphide, which is doped with suitable metals such as gold, silver, copper, gallium, or manganese. A dielectric layer, for example, barium titanate, applied to the active layer, prevents a short-circuit between the electrodes, if the (typically non-translucent) counter-electrode complements the generic film arrangement of known art.

From the prior art it is also of known art to apply the active layer and/or the dielectric layer by means of a screen printing method, wherein suitable coating materials provided in the form of pastes for screen printing are commercially available and are provided, for example, by manufacturers such as DuPont.

In particular in the mass production of optoelectronic film arrangements of this kind the transparent ITO-PET front electrode is found to be cost-critical, and in addition is fragile. ITO must furthermore be applied as a very thin coating in order to be sufficiently optically transparent; as a result the electrical conductivity in turn suffers (and thus is typically more than 50 Ω/sq, and therefore has electrical resistance properties that are not insignificant). From this a number of disadvantages in turn ensue: Firstly, items of lighting equipment based on ITO require a power rail, i.e. a connecting rail (typically implemented in terms of silver or silver print) in order to ensure the electrical connection. Thus one dimension of the product is already defined at this point in time, so that, for example, a continuous, endless manufacturing process (with the corresponding cost and quantity advantages) is ruled out. Also these geometrical specifications result in a problem of restricted dimensions with which an even brightness is achieved, and a maximum cut-off frequency for activation is limited by the structure as described.

Accordingly there exists the need for alternative, mechanically improved materials that are potentially cost-effective (but nevertheless enable implementation of a transparent planar electrode), and which, moreover, have improved electrical, i.e. resistance, properties, and less demanding contact requirements.

SUMMARY OF THE INVENTION

The object of the present invention is therefore to create an alternative film arrangement for purposes of implementing an electroluminescence film, which in particular is optimised with regard to production costs and also the need for expensive materials for the implementation of a transparent electrode surface. Furthermore a new, i.e. improved, method for the manufacture of an EL film arrangement is to be created.

The object is achieved by means of the optoelectronic film arrangement with the features of the main claim, the method for the manufacture of an optoelectronic film arrangement with the features of claim 27, and also the application with the features of claim 36. Advantageous further developments of the invention are described in the dependent claims.

In an inventively advantageous manner, at least one of the two electrode layers, or both, has a fabric, which has electrically conducting fibres.

This fabric thus offers the possibility of implementing the electrode functionality in an efficient and cost-effective manner, wherein at the same time—by means of a suitable configuration of the fabric in the selection of the respective fibre thickness, the configuration of the interspaces between the fibres and the kind of electrically conducting fibres—options for the configuration of the desired properties, and for adaptation to a particular intended application of the optoelectronic film arrangement, are made possible in a very flexible manner. Moreover, this arrangement is flexible and can be shaped in almost any manner.

Thus it is firstly preferable, for purposes of stabilisation and for the protection of the fabric against moisture or other environmental influences, to embed the latter (at least partially) into a transparent, electrically non-conducting polymer material. In this manner can not only the colour of the light be influenced (for example, by suitable colouring of this polymer material), but also, by a suitable selection of the polymer material, the electrode (and thus the overall arrangement) can be implemented in a weather-resistant manner.

For the practical implementation of the coating for the fibres, it is possible within the framework of preferred further developments of the invention to configure the coating in the form of a radiation-cured, in addition or alternatively, a thermally-cured resin, wherein an acrylic resin, a silicon material, a fluoropolymer can be suitable, as can be a polymer selected from a group consisting of PU, PEN, PI, PET, PA, EVA or comparable materials.

With regard to the inventive fibres the invention firstly comprises the manufacture of the fabric essentially from electrically non-conducting fibres, which then for purposes of implementing the electrode function are provided with an electrical conductivity. Suitable fibres are in particular transparent or semi-transparent monofilaments of PA, PP, PET, PEEK, PI, PPS, or similar chemical fibres. In comparison to pure metal fibres (with comparable electrical conductive properties) these fibres enable significant cost advantages; moreover these cost advantages are particularly dramatic in comparison to use of the generic ITO coating application.

For the production of the electrical conductivity, wherein the fabric deployed preferably has a sheet resistance <50 Ω/sq, preferably <20 Ω/sq, more preferably, less than Ω/sq, the invention on the one hand comprises in accordance with further developments the provision of fibres in the fabric that consist of metal (metal fibres), or fibres that have been metallised. Suitable metals for purposes of implementing the metallised or metal fibres are, for example, Ti, Ag, Al, Cu, Au, Pa, Pt, Ni, W, Mo, Nb, Ba, Sn, Zr or similar, wherein the conductivity of the fabric (i.e. the sheet resistance) can be suitably established by the geometry with which such a metal or metallised thread can be woven together with non-conducting threads. The framework of suitable forms of embodiment of the invention includes not only the provision of such conducting threads in the form of a 1:1 weave (i.e. all threads to be coated metallically), but also 1:2, 1:3 or higher, in addition or alternatively by selection of the actual direction (weft, warp), in which a metallic or metallised fibre should be woven to perform the conductivity adjustment (in particular, weaving in both directions weft, warp is also envisaged).

On the other hand it is possible and envisaged within the framework of preferred forms of implementation of the invention to establish the electrical conductivity, i.e. the desired low-ohmic sheet resistance, by metallisation of the fabric (i.e. after it has been woven), which of itself typically consists of non-conducting polymer fibres (wherein in principle here too metallic fibres can be woven in). Such an application of a metallic coating to the fabric can suitably take place by means of plasma sputtering (e.g. with Ag, Au, Ti, Mo, Cr, Cu, ITO, ZAO or similar), alternatively, by means of vaporisation (Al, Ag, Cu, etc.) or by means of wet chemical methods such as electrolysis, for example, the deposition of Ag, Ni. Typically a metallisation of the fabric of this kind provides a particularly high conductivity, which results in a sheet resistance <10 Ω/sq.

A particular advantage of the invention consists in the high translucency or transmission factor of the inventively applied fabric. This can be particularly advantageously influenced by adjustment of the inventively established mesh openings, wherein in particular methods of known art for the manufacture of precision fabrics can advantageously be used here. For implementation of the inventively provided mesh openings with an inventively open surface area of between 20% and 85% it has been demonstrated to be particularly preferable to set mesh sizes in the range between 30 μm and 300 μm, i.e. to establish the surface area of such a mesh opening (preferably constant over the surface) within a range between approx. 800 μm$^2$ and approx. 800,000 μm$^2$.

Inventively advantageously, moreover, the overall transmission factor (in %) of an inventively manufactured fabric as a rule is higher than the open surface area of the fabric; to the so-called direct transmission factor, namely the passage of light through the meshes, and also through transparent fibres, is to be added a diffusive transmission factor, in which (for example, in the case of metallically coated fibres), a reflection at the fibre or by the fibre is taken into account, so that the end result is that with a range of inventively open surface area between 20% and 85% an actual overall transmission factor of between 25% and 95% can be achieved.

In accordance with preferred further developments of the invention the dielectric layer (which itself in turn can be applied in a multi-layer manner if so required, preferably by means of successive application, curing or drying, and application of at least one further layer) is implemented by means of screen printing in the same manner as the active layer can be applied by means of screen printing. Here too, preferred further developments of the invention comprise the design of the active layer as a plurality of successively applied layers by means of screen printing (or by means of other coating application methods), in particular also, by means of coating methods that enable a continuous, endless (reel-to-reel) coating application.

The present invention provides in accordance with a preferred further development the possibility of creating in an extremely simple and elegant manner an EL film arrangement, which emits light on both sides, i.e. both from the first electrode layer (front electrode), and also from the opposite second electrode layer (counter-electrode), and inasmuch offers in a simple manner the possibility of creating completely new warning or message surfaces, or similar applications, that can be used on one or both sides. This takes place within the framework of preferred further developments of the invention in that both electrode layers are implemented in the form of the inventively deployed fabric, wherein additionally at least one of the electrode layers offers the possibility, by embedding the dielectric layer (still in a pasty i.e. non-cured state) into a suitable material, of combining the advantage in production terms of a secure and reliable connection with simple and cost-effective manufacturability.

Such a procedure is claimed within the framework of the inventive method and advantageous configurations of the same.

The present invention thus makes possible, in a potentially simpler, more elegant and cost-effective manner suitable for mass production, the manufacture of optoelectronic film arrangements for a multiplicity of (electroluminescence) applications. Depending on the need to use the lighting characteristics on one or both sides, the spectrum of possible applications extends from inventive lighting and/or messaging devices for consumer and/or household electronics, via the sectors of lighting, advertising, construction, trade fairs, architecture, safety or transport, through to specific applications in air transport or military technology.

BRIEF DESCRIPTION OF THE DRAWINGS

Further advantages, features, and details of the invention ensue from the following description of preferred examples of embodiment and also with the aid of the individual drawings; in the latter:

FIGS. 3a, 3b show a third form of embodiment of the present invention in two variants, corresponding to the first form of embodiment, but with the difference that a fabric is directly coated with an active layer material.

FIGS. 1a and 1b clarify in the schematic representation the structure of an EL film arrangement in accordance with a first example of embodiment for the implementation of the invention:

DETAILED DESCRIPTION OF THE PREFERRED EMBODIMENT(S)

Figure 1A:
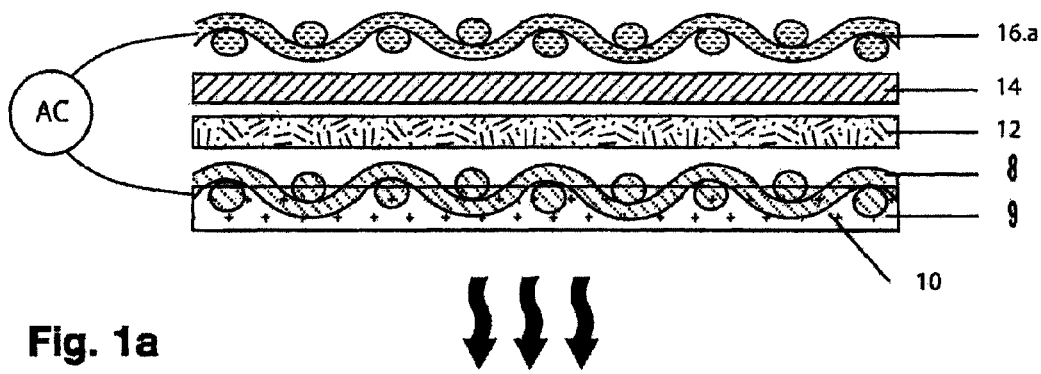
FIGS. 1a, 1b show a schematic coating structure of the optoelectronic film arrangement in accordance with a preferred form of embodiment of the present invention, and also a variant of this form of embodiment.

A PET fabric material 8 (in the example: PET 1000 120-23, manufacturer: Sefar, Thal, Switzerland) with silver-coated PET fibres (here: 120 fibres/cm, 23 μm thread diameter, thickness of the silver coating approx. 500 nm) is provided with a transparent polymer material 9 (here: an acrylic resin), so that a first planar and transparent electrode layer 10 is implemented. Contact can be made with this electrode layer 10 in the side region and it has a thickness of typically between 30 μm and 200 μm. In this manner a layer is formed, which on one planar side is non-conducting, and on its other planar side is conducting.

Onto this first electrode layer, which in the design shown enables a transmission factor for visible light of approx. 50%, an active layer 12 is provided by means of screen printing (or other suitable coating application methods). In a particularly preferred manner, this active layer is also applied by means of an endless process by means of suitable coating application methods, such as squeegee spreading, spraying, dip coating, or similar. The active layer has zinc sulphide doped with copper, $Al_2O_3$ additionally mixed in as a further component, and is prepared as an ink/paste that can be screen printed. This ink (typically available commercially as the product E80-02SB, manufacturer: Mobichem) is applied in a single coating such that a thickness of the dry, active layer 12 is between 30 μm and 80 μm.

Onto this active layer in turn by means of screen printing (or another alternative coating method, see above) a dielectric layer (dielectric layer 14), is applied. Here this application takes place in two stages, wherein firstly a first layer is applied by means of screen printing (typically used paste: type D80-01, manufacturer: Mobichem, a common barium titanate paste, wherein the screen printing pastes used can be thinned by means of suitable solvents in accordance with the coating requirements, typically thinning of between 0 and 50% occurs). The application takes place such that after drying (at 110° C. to 130° C., for 20 to 30 minutes) this first layer has a coating thickness of approximately 5 to 40 μm. Onto this layer a second coating of the same dielectric material is then applied by means of screen printing (or another coating application method), wherein after the application (once again for purposes of achieving a comparable coating thickness) a silver-metallised PET fabric 16a (corresponding to the type used for the electrode layer 10) is laid into the not yet dried material of the second layer, such that the fabric material (partially) penetrates into the applied dielectric material. Only then (with an interposed rolling-on or pressing-on of the fabric material forming the second electrode layer 16a, if required) does the drying process take place with the supply of heat.

In a further, alternative form of embodiment a first and also a second dielectric layer are applied successively, after a previous coating has been dried. Each dielectric layer (14) is applied under the same process conditions as described above by means of screen printing or another coating method, such that a dried layer possesses an average thickness in the range between some 5 μm and 40 μm. A metallised coating (16b) is subsequently applied onto the (second) dielectric layer, after the latter has dried. Such a metallised coating on the multi-layer structure can, for example, suitably take place by means of plasma sputtering (for example, with Ag, Au, Ti, Mo, Cr, Cu, ITO, ZAO or similar), or alternatively by means of vapour deposition (Al, Ag, Cu, etc.). Typically the metallisation takes place in the form of silver with a thickness in the range between 25 and 200 nm. The sheet resistance of this coating should preferably be relatively low, in particular <5 Ω/sq. By means of this additional form of embodiment the advantage of a homogeneous metal thickness is implemented, which leads to an homogeneous distribution of brightness in the end product.

Figure 1B:
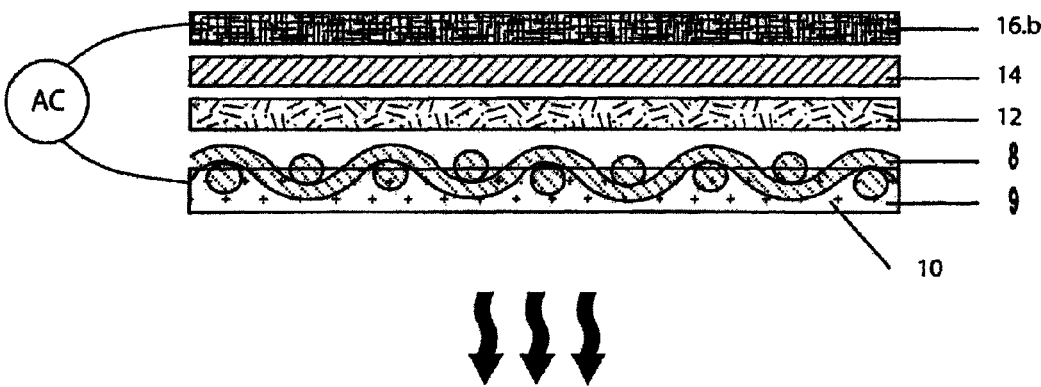

Contact is suitably made with the first electrode layer and the second electrode layer in the edge region; FIGS. 1a and 1b illustrate the symbolic application of an alternating voltage signal for purposes of operating the device, which radiates light from both electrode surfaces.

In the first example of embodiment described in the variant of FIG. 1a the coating of the dielectric takes place in two steps, as described. Here the second metallised PET fabric 16a is preferably selected in (optical) conjunction with the fabric of the transparent electrode 10 and is aligned in order to avoid a (disadvantageous) moiré effect. Typically this is achieved by aligning the two fabrics at a predetermined angle relative to one another.

FIG. 1b describes an additional and alternative route to the implementation of the first example of embodiment, wherein the second dielectric layer 14 is applied in the same manner as the first layer. However, a metallised coating 16b is applied onto the second dielectric layer, after the latter has been dried. Such a metallised coating can, for example, suitably take place by means of plasma sputtering (e.g., with Ag, Au, Ti, Mo, Cr, Cu, ITO, ZAO or similar), or alternatively by means of deposition (Al, Ag, Cu, etc.). ITO is, however, less preferred. Typically the metallisation is implemented in silver with a thickness in the range between 20 and 200 nm, and with a sheet resistance that is relatively low at <5 Ω/sq. Advantages are a homogeneous metal thickness, and thus a greater homogeneity of the brightness of the end product.

One advantage of the above-described first example of embodiment lies in the fact that relatively rough interfaces are formed between the layers. This has a positive effect on light refraction and light distribution in the layer arrangement, and prevents light traps.

Figure 2:
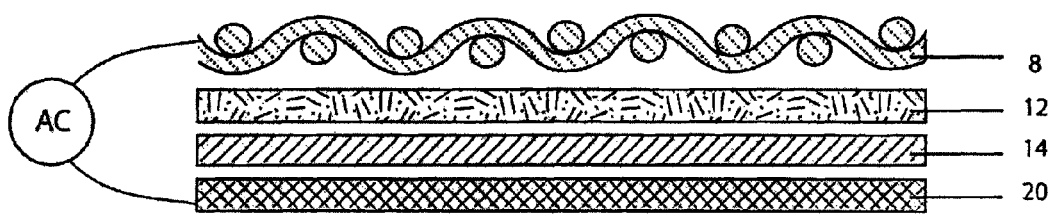
FIG. 2 shows a second form of embodiment of the present invention as a form of embodiment that is inverted compared with the first form of embodiment, i.e. in which the sequence of coatings has been reversed.

With the aid of FIG. 2 a second form of embodiment of the present invention is now elucidated; this can also be understood as an "inverted" variant, since, compared with the first example of embodiment described above, the sequence of the layers is reversed. To be more precise, the counter-electrode is firstly coated with a dielectric, then the active layer is applied, on top of which the transparent electrode is then applied.

In this regard, FIG. 2 shows in the schematic arrangement how the rear electrode is implemented in terms of a conducting film 20 (typically a metallised film material in order to achieve a desired conductivity). This film is thermally stabilised, in order that (after drying) it is stable for the paste that is to be applied; such thermal stabilisation takes place at a range of temperatures between 130° C. and 180° C. The film 20 is thin and flexible for purposes of implementing a so-called "foil back structured lamp"; this is typically achievable with a PET film with an average thickness between 40 μm and 100 μm (and with a preferred thickness of approx. 50 μm). Metallisation suitably takes place with the aim of achieving a sheet resistance typically <50 Ω/sq, more preferably <20 Ω/sq, even more preferably <10 Ω/sq.

Applied onto the film is a (single or double) dielectric layer 14. The application of the dielectric layer(s) takes place in the same manner as described above in the context of the first example of embodiment, wherein once again the screen printing paste can be thinned in a suitable manner and dried in the manner described above.

After the dielectric layer(s) has/have been dried, the active layer 12 is applied. This once again corresponds to the method described above in the context of the first example of embodiment (with a corresponding screen printing paste, supplier, steps in manufacture and drying, and coating). Onto this layer is applied a PET fabric 8 metallised with silver (in a manner corresponding to the electrode layer), and in fact into the not yet completely dried material of the last coating application, such that a (partial) interpenetration of the fabric material with the active material takes place. Afterwards the arrangement is dried (if necessary after the second electrode layer 8 has been pressed onto or into the active material). In this example of embodiment by the introduction of the fabric it is advantageously achieved that the EL particles of the active layer form very good contact with the fabric, but do not penetrate through the fabric (since in this case those EL particles of the active layer that do not lie between the two electrodes, do not emit any light, and accordingly and disadvantageously cause dark flecks or inhomogeneities in the light distribution).

What is once again advantageous in this second example of embodiment is the (respective) application of the coatings in an endless form, such that in this respect manufacturing can take place efficiently in a manner suitable for mass production. The form of implementation elucidated above in connection with the second example of embodiment is particularly advantageous from this point of view.

Finally in the context of the third example of embodiment a variant of the first example of embodiment is to be elucidated with the aid of FIGS. 3a and 3b. Here the same sequence of layers is selected as in the first example of embodiment, wherein the difference lies in the fact that instead of application of a transparent coating to the fabric, with an active layer applied onto the transparent coating, in the case of the third example of embodiment the fabric is directly coated with the (EL) active layer.

This can be schematically discerned with the aid of FIGS. 3a and 3b respectively. Thus a PET fabric material 8 (once again, for example: PET 1000 100-23, manufacturer: Sefar, Thal, Switzerland) with silver-coated PET fibres (here: 120 fibres/cm, 23 μm thread diameter, thickness of the silver coating approx. 500 nm) is (directly) provided with the active layer, so that the fabric is partially embedded into the coating on one side, and completely embedded on the other side.

The dielectric layer is then applied in the same manner as described above in the context of FIGS. 1a and 1b respectively, wherein once again the two variants are suitable for purposes of implementing the counter-electrode.

The forms of embodiment described above are not to be understood as definitive, rather within the framework of the present invention it is possible to vary the various parameters, materials and process conditions.

Thus it lies within the framework of inventive embodiments, suitably to adjust the respective process steps of application, drying, etc., also in particular the provision of a plurality of layers for both the dielectric layer and also the active layer of electroluminescent material, in order to fulfil a particular application in this respect. As elucidated in the introduction to the description, numerous options exist for prescribing the colour of the light, brightness/translucency, mechanical load capability, and other parameters, in particular by the adjustment and selection of suitable fabric properties. These include the selection and adjustment of suitable fibre thicknesses and mesh sizes, also the selection and configuration of a suitable coating application, the selection and establishment of an advantageously selected polymer material, in particular for the first electrode layer and/or the adjustment of the process parameters referred to for purposes of implementing a dielectric and/or active layer.

Within the framework of preferred further developments of the described method and/or for purposes of implementing alternative designs of the inventively manufactured optoelectronic film arrangement it is sensible, by means of fixing methods (for example, by tensioning the fabric for the second electrode layer in a frame) to control the relative positions and/or a fabric pre-tension before the fabric is introduced. If, for example, a metallised PET fabric (16a) is selected as the counter-electrode, the properties of the fabric should be carefully determined and/or measured with reference to the electrode layer 10 in order, for example, to avoid any disadvantageous moiré effects. Here a typical procedure involves the second metallised fabric being applied at a predetermined angle with respect to the first electrode layer.

In conclusion, by means of the present invention a variable, flexible electroluminescence film arrangement that is cost-effective to manufacture is formed in a surprisingly simple and elegant manner, which potentially can make the EL technology accessible to an even wider range of applications. Also, this film arrangement can be manufactured in an endless ("reel-to-reel") manner, and large emission surface areas with a high level of homogeneity of brightness and radiation can advantageously be implemented; an additional advantage is the applicability of comparatively high cut-off frequencies and control voltages.

The invention claimed is:

1. An optoelectronic film arrangement, with
   a first planar electrode layer,
   a second planar electrode layer as a counter-electrode to the first planar electrode layer,
   a dielectric layer between the first and second planar electrode layers, and an active layer of an electroluminescent material provided adjacent to the dielectric layer and arranged between the first and second planar electrode layers, wherein at least one of the first and the second electrode layer is implemented to be translucent and free of TCOs or ITO, by means of a fabric having electrically conducting fibers, and
   wherein the fibers have a fiber diameter between 18 μm and 32 μm, and a mesh size of mesh openings of the fabric in the range between 50 μm and 70 μm and wherein each said mesh opening has a surface area in the range between 800 μm$^2$ to 800,000 μm$^2$.

2. The film arrangement in accordance with claim 1, wherein the fabric is provided with a coating having a transparent, electrically non-conducting polymer material, such that the fibers are at least partially surrounded by the polymer material.

3. The film arrangement in accordance with claim 2, wherein the polymer material of the coating is designed and/or selected such that the coating is weather-resistant, UV-resistant, and/or promotes a weather resistance of the substrate.

4. The film arrangement in accordance with claim 2, wherein the polymer material is designed to be radiation-cured, or thermally cured.

5. The film arrangement in accordance with claim 2, wherein the polymer material is selected from the group consisting of an acrylic resin, silicon, a fluoropolymer, PU, PEN, PI, PET, PA, EVA, and mixtures thereof with SiOx, ORMOCER, or other inorganic materials.

6. The film arrangement in accordance with claim 1, wherein the fibers have a material, which is selected from the group consisting of PA, PP, PET, PEEK, PI, PPS, PBT, PEN.

7. The film arrangement in accordance with claim 1, wherein the fabric has mesh openings, which implement an open surface area of 20% to 95%.

8. The film arrangement in accordance with claim 1, wherein said open surface is between 40% and 60%.

9. The film arrangement in accordance with claim 1, wherein the electrically conducting fibers have a metallization applied to a polymer core.

10. The film arrangement in accordance with claim 9, wherein the metallization is selected from the group consisting of Ni, Ti, Mo, W, Cr, Cu, Ag, Al, and Au.

11. The film arrangement in accordance with claim 9, wherein the metallization has a coating thickness in the range between 100 nm and 10 µm.

12. The film arrangement in accordance with claim 9, wherein the metallization has a coating thickness in the range between 200 nm and 3 µm.

13. The film arrangement in accordance with claim 1, wherein the fabric has a metallization which is applied as a coating onto the fabric.

14. The film arrangement in accordance with claim 13, wherein the metallization is applied onto the fabric by means of sputtering, plasma sputtering, vaporization and/or wet chemical methods, and electrolytic methods.

15. The film arrangement in accordance with claim 13, wherein the fabric has a sheet resistance <50 Ω/sq.

16. The film arrangement of claim 1, wherein the fabric has a sheet resistance of <20 Ω/sq.

17. The film arrangement of claim 1, wherein the fabric has a sheet resistance of <10 Ω/sq.

18. The film arrangement in accordance with claim 1, wherein at least one of the dielectric layer and the active layer is applied by means of screen printing, or another coating method.

19. The film arrangement in accordance with claim 18, wherein at least one of the dielectric layer and the active layer is applied in a multi-layered manner.

20. The film arrangement in accordance with claim 1, wherein the first and the second electrode layers are designed as translucent fabric layers for purposes of implementing an EL film arrangement that emits light on both sides.

21. The film arrangement in accordance with claim 1, wherein the counter-electrode has a polymer film material.

22. The film arrangement in accordance with claim 21, wherein the polymer film material has a thickness in the range between 30 µm and 100 µm.

23. The film arrangement in accordance with claim 21, wherein the polymer film material has a thickness in the range of between 40 µm and 80 µm.

24. The film arrangement in accordance with claim 21, wherein the polymer film has a thickness in the range of between 40 µm and 60 µm.

25. The film arrangement in accordance with claim 21, wherein the counter-electrode implemented from the polymer film material is thermally stabilized to be stable at temperatures in a range between 140° C. and 180° C.

26. The film arrangement in accordance with claim 21, wherein the counter-electrode formed from the polymer film material has a metallization applied thereon.

27. The film arrangement in accordance with claim 26, wherein the metallization of the counter-electrode is selected from the group consisting of Ni, Ti, Mo, W, Cr, Cu, Ag, Al, and Au.

28. The film arrangement in accordance with claim 27, wherein the metallization is provided in a coating thickness between 100 nm and 10 µm in particular between 200 nm and 3 µm.

29. The film arrangement in accordance with claim 27, wherein the metallization is provided in a coating thickness between 200 nm and 3 µm.

30. The film arrangement in accordance with claim 27, wherein the metallization is applied by means of at least one sputtering, plasma sputtering, deposition and wet chemical processes, and electrolytic processes.

31. The film arrangement in accordance with claim 21, wherein the counter-electrode present as a metallised and thermally stabilised polymer film has a sheet resistance <20 Ω/sq.

32. The film arrangement in accordance with claim 31, wherein the sheet resistance <5 Ω/sq.

33. The film arrangement in accordance with claim 31, wherein the sheet resistance is <2 Ω/sq.

34. The film arrangement in accordance with claim 1, wherein the first and the second electrode layers are implemented in a manner free of ITO.

35. A method for the manufacture of an optoelectronic film arrangement in accordance with claim 1, comprising the steps of:
at least partially embedding a fabric having electrically conducting fibers into a transparent, electrically non-conducting polymer layer for purposes of manufacturing a first electrode layer that is free of TCOs;
applying an active layer of an electroluminescent material onto the first electrode layer by means of screen printing;
applying a dielectric layer onto the active layer by means of screen printing;
applying a second electrode coating as a counter-electrode to the first electrode coating onto the dielectric coating, wherein the fibers have a fiber diameter between 18 µm and 32 µm, and a mesh size of mesh openings of the fabric lies in the range between 50 µm and 70 µm and wherein each said mesh opening has a surface area in the range between 800 µm² to 800,000 µm².

36. The method in accordance with claim 35, wherein the application of the second electrode layer has the at least partial introduction into the dielectric layer of a fabric having electrically conducting fibers such that the fibers of the second electrode layer are introduced into the not yet cured or dried material of the dielectric layer.

37. The method in accordance with claim 35, wherein the second electrode layer is applied onto the dried dielectric layer by one of a metallization process, plasma sputtering and vapor deposition.

38. The method in accordance with claim 35, wherein the application of the active layer and/or the application of the dielectric layer takes place in a multi-layer manner, by means of successive application and curing and/or drying of individual layers of the coating concerned.

39. The method in accordance with claim 35, further comprising shaping of the first electrode layer to adapt the first electrode layer onto a non-planar carrier.

40. The method in accordance with claim 35, further comprising adjusting at least one of an electrical conductivity, transparency and color at least one of the first and second electrode layer.

41. The method in accordance with claim 35, wherein a first and a second dielectric layer are applied onto a thermally stabilized and metallized polymer film as a counter-electrode, by means of a continuous, endless coating process, whereupon the active layer and a fabric layer having electrically conducting fibers are applied.

42. The method in accordance with claim 41, wherein the application of the fabric layer having electrically conducting fibers comprising the at least partial embedding of the fibers into the not yet cured or dried material of the active layer.

43. The method in accordance with claim 41, wherein the application of the active layer takes place in a multi-layer or a multi-coating manner by means of successive coating applications and curing and/or drying processes of individual layers.

* * * * *